United States Patent [19]

Kern et al.

[11] Patent Number: 4,544,843

[45] Date of Patent: Oct. 1, 1985

[54] RADIATION DETECTOR WITH BUILT-IN TEST CAPABILITY

[75] Inventors: Mark T. Kern, Goleta, Calif.; Robert A. Bell, Salem, N.H.; Max J. Riedl, Santa Barbara, Calif.

[73] Assignee: Santa Barbara Research Center, Goleta, Calif.

[21] Appl. No.: 461,896

[22] Filed: Jan. 28, 1983

[51] Int. Cl.⁴ .............................................. H01J 5/02
[52] U.S. Cl. ..................................... 250/239; 250/227
[58] Field of Search .................... 250/211 J, 574, 239, 250/551, 386, 387, 393, 252.1; 324/158 D, 158 R, 74; 357/19, 30, 31; 29/572; 455/610, 612; 356/230, 227

[56] References Cited

U.S. PATENT DOCUMENTS

| | | | |
|---|---|---|---|
| 3,639,770 | 2/1972 | Zizelmann | 250/55 J |
| 4,074,143 | 2/1978 | Rokos | 357/19 |
| 4,100,422 | 7/1978 | Thillays | 357/19 |
| 4,112,308 | 9/1978 | Olschewski et al. | 357/19 |
| 4,125,777 | 11/1978 | O'Brien et al. | 250/239 |
| 4,217,490 | 8/1980 | Fiorito et al. | 250/211 J |

Primary Examiner—David C. Nelms
Assistant Examiner—J. Jon Brophy
Attorney, Agent, or Firm—Ronald L. Taylor; Mark J. Meltzer; A. W. Karambelas

[57] ABSTRACT

A device having a light emitter coupled to direct light to a portion of a photodetector to provide Built-In Test Equipment (BITE) capability for an optical sensor. A light emitting diode and a photodiode are mounted side by side on the upper surface of a conventional header with suitable electrical connections bonded thereto. A prismatic light bridge member overlies the light emitting diode and extends to cover a portion of one corner of the photodetector. This member serves as a light conduit, directing virtually all of the light from the emitter to the detector by virtue of the near total internal reflection of the surfaces of the light conduit member. An outer enclosure having a transparent glass window serves to seal and protect the respective elements while permitting external radiation to reach the photodetector.

Alternative embodiments provide for coupling of light from a single emitter or a plurality of emitters to a single associated photodetector.

15 Claims, 4 Drawing Figures

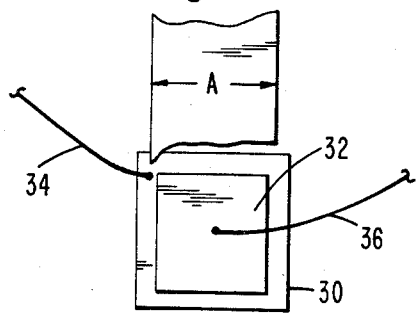
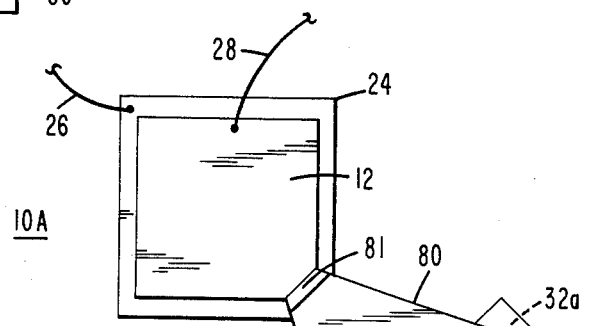
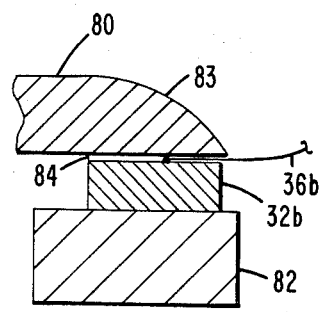

RADIATION DETECTOR WITH BUILT-IN TEST CAPABILITY

BACKGROUND OF THE INVENTION

1. Field of the Invention

This invention relates to the field of radiation detectors and, more particularly, to electromagnetic radiation sensors having a self-test capability incorporated therein.

2. Description of the Prior Art

There are numerous instances in the prior art where it is desired to detect electromagnetic radiation in the optical range. Typically photodetectors, which may be selected for their response sensivity to optical radiation in a specified frequency band (such as the infrared), are mounted to receive incident radiation. The output of the photodetector, which may be an electrical signal corresponding to the incident radiation, is applied to suitable electrical circuitry for processing.

In certain applications of such systems, it is desirable to stimulate a detector optically in order to generate some kind of system response. For example, to generate a built-in test equipment (BITE) capability for an optical sensor, it would be advantageous to provide an optical stimulus, rather than an electrical stimulus, since the optical stimulus can provide a better functional test of the optical detector element.

It has become customary in the manufacture of low cost detectors and emitters to mount the detector or emitter "chip" to small headers, which are small standard transistor mounting devices. These headers are produced in large volume and therefore are very economical to use. They typically incorporate lead feedthroughs and high quality glass-metal seals. An optical detector (e.g., a silicon photodiode) can be very readily mounted on such a header, as can also an optical emitter (e.g., a GaAs infrared emitting diode—IRED). However, when both the detector and emitter are mounted on such a header in conventional fashion, as would be required for low cost construction, the emitter would be aimed in the same direction as the detector; that is, 180° away from the direction of the optical radiation input to the detector. In practice, the detector could still receive a small amount of the radiation from the emitter, due to stray reflection from various parts of the detector/emitter package. However, this small amount of optical coupling would imply that large drive currents would be required to the emitter to couple a reasonable amount of radiation onto the detector. Also, it would be difficult to control the coefficient of coupling, since the arrangement depends upon uncontrolled stray reflection.

Devices are known which provide for optical coupling between the emitter and detector in a single device. Examples of such may be found in U.S. Pat. Nos. 3,914,137 of Huffman et al, 4,124,860 of Johnson, and 4,160,308 of Courtney et al. These devices are optically coupled isolators which are used for coupling signals between separate electrical circuits in which it is essential that there be no electrical interconnection. For example, these optically coupled isolators are particularly useful in completing the control link between microprocessor circuitry used to control a plant production line and the specific motor power circuits for a conveyor system. Such devices are not, however, applicable to the need to which the present invention is directed, since they do not incorporate an optical detector which is responsive to external radiation while at the same time being coupled to receive optical stimulus from an associated emitter for test purposes. Quite the contrary, in such optically coupled isolator devices it is essential that the optical detectors therein be immune to extraneous radiation. Thus, while the light-emitting and photo-sensitive chips of the device disclosed by Johnson are mounted on a substrate which is mounted on a conventional header with both chips being encapsulated in optically transparent material in a hemispherical shape for maximum internal reflection of light, an encapsulation cap, not shown in the drawing of the Johnson patent, shields the entire structure from ambient light. Similarly, in the device disclosed by Courtney et al, although the emitter and detector elements face each other, protection from ambient light is provided by encapsulating the entire structure in a moulding compound. The device of Huffman et al uses a metal shield to block ambient light. Such devices, therefore, are not useful as detectors of external radiation.

SUMMARY OF THE INVENTION

In brief, arrangements in accordance with the present invention comprise a photodiode as the detector of optical radiation. In the preferred embodiment, this photodiode is mounted on a header as previously described and is encased within a cylindrical metal enclosure or can, the upper end of which constitutes a generally planar glass window sealed to the can by a glass-metal seal. Thus the photodiode is capable of receiving external optical radiation through the glass window over a wide angle of incidence, approaching 180°.

To achieve the desired BITE, a small GaAs IRED is also mounted on the header in generally the same plane as the detector diode. An optical bridge element is mounted in position over the emitter diode and extends to cover a small corner portion of the detector diode. This bridge element serves as a light conduit to couple optical radiation from the emitter to the photodiode. The bridge element is preferably molded of plastic for economy of construction, but may be made of glass or other materials if desired.

In one preferred embodiment, the bridge element is generally square in cross-section and has its opposite ends formed as prisms for optimum efficiency in coupling light from the emitter into the bridge element, along the bridge element, and then directing the light downward onto the associated portion of the photodiode with which it is in contact.

In an alternative embodiment, the bridge element is shaped like a wedge with the narrow end being positioned over one corner of the photodiode and having a bevelled face to develop the prism shape to direct light from the bridge element onto the photodiode. The opposite end of the element, being broader in extent, is positioned over a plurality of emitter diodes in order that a greater amount of light may be directed to the photodiode for the test function without impinging upon the surface of the photodiode remaining for the detection of external radiation. While the emitting diodes of this arrangement could be energized individually or in groups to develop different levels of radiation for testing the amplitude response of the photodetector system, their respective leads are commonly connected in parallel in order that the maximum level of light available from the emitting diodes may be used for stimulating the photodetector system during testing.

In the first preferred embodiment, the opposite ends of the light bridge element are bevelled to develop planar surfaces forming prisms with the respective faces at characteristic angles selected in accordance with the frequency of radiation, index of refraction, and other applicable parameters as are well known to those skilled in the art. If desired, however, the ends of the bridge element may be curved rather than planar; for example, one end of the element may be parabolic or elliptical in shape in order to maximize the light transmission capability of the element. In the second preferred embodiment, the end of the wedge-shaped element which is mounted over the plurality of emitter diodes is parabolic in cross-section in order to achieve the maximum coupling of light from the emitter diodes and redirection of the light along the extent of the bridge element to direct it onto the photodiode.

BRIEF DESCRIPTION OF THE DRAWING

A better understanding of the present invention may be had from a consideration of the following detailed description, taken in conjunction with the accompanying drawing in which:

FIG. 2 is an enlarged plan view, partially broken away, showing details of the mounting of an emitter diode in association with the optical bridge element;

FIG. 3 is an enlarged plan view showing details of a second particular arrangement in accordance with the invention; and FIG. 4 is a sectional view taken along the line 4—4 of FIG. 3, looking in the direction of the arrows.

DESCRIPTION OF THE PREFERRED EMBODIMENTS

Figure 1:
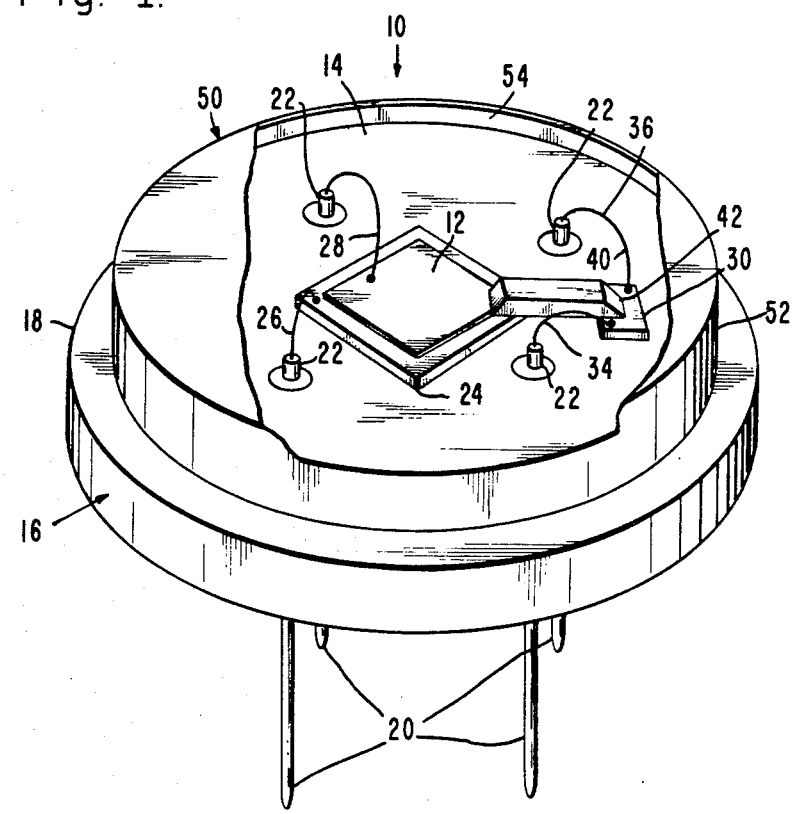
FIG. 1 is a perspective view, partially broken away, of one particular arrangement in accordance with the present invention.

The arrangement of the invention depicted in FIG. 1 is shown comprising a device 10 having a photodiode 12 centrally positioned on the upper surface 14 of a standard transistor can 16, commonly referred to as a TO-5. The designation "TO-5" refers to the size of the header, and other standard sizes such as TO-8 and TO-8 may be employed, as desired. The header 16 has a conventional housing 18, a plurality of terminal pins 20 for mounting the unit in a standard circuit board socket, and a plurality of feed-through leads or pins 22 extending through the upper surface 14 and affixed therein by glass-metal seals. The pins 22 are connected respectively to the terminal pins 20 internally of the header 16.

In the device 10 of FIG. 1, the photodiode 12 is mounted on a ceramic pad 24 which is in the range of from 0.020 to 0.040 inches in thickness. The photodetector diode 12 is approximately two millimeters (about 0.080 inch) square; the ceramic pad 24 is slightly larger than the photodiode 12. The pad 24 is plated on its upper surface with a gold layer, and the photodiode 12 is affixed thereon by conducting epoxy. The back surface of the photodiode 12 constitutes one terminal of the diode and the electrical connection thereto is effected through the conducting epoxy, the gold plated layer on the ceramic pad 24 and a lead 26 extending between an adjacent feed-through terminal 22 and one corner of the gold plated layer on the ceramic pad 24. The upper surface of the photodiode 22 being the other diode terminal, electrical connection thereto is effected via a lead 28 extending between another adjacent feed-through terminal 22 and the upper surface of the diode 12. The leads 26, 28 may be attached to the respective surfaces of the ceramic pad 24 and the photodiode 12 by using thermo-compression ball bonding techniques to establish reliable electrical connections.

A similar ceramic pad 30, gold plated along its upper surface and bearing an emitting diode 32 (see FIG. 2), is affixed to the upper surface 14 of the header 16 along a diagonal of the photodetector 12 and radially outward therefrom. The mounting of the diode 32 on the ceramic pad 30 and the attachment of electrical leads 34, 36 respectively to a corner of the plated surface of ceramic pad 30 and the central region of the emitting diode 32 are effected in the same fashion as described hereinabove with respect to the photodetector. The emitter diode 32 is approximately 0.018 inch square, and the ceramic pad 30 is slightly larger than the emitter diode 32.

Overlying the emitter diode 32 is a bridge element 40 which extends from the emitter diode 32 to the photodiode 12 where it covers a small portion in one corner thereof. The bridge element 40 is slightly rectangular in transverse cross-section and has a lateral dimension A (see FIG. 2) which slightly exceeds the lateral dimension (approximately 0.018 inch) of the emitter diode 32. Furthermore, as may be seen in FIG. 1, the bridge element 40 completely covers the upper surface of the emitter diode 32. Member 40 is provided with bevelled faces 42 and 44 at opposite ends thereof which serve as prisms to make the member 42 effective as a light conduit to transmit light from the emitter diode 32 to the photodiode 12. The bevelled face 42 reflects light entering the member 40 from the emitting diode 32 and redirects it internally of the member 40 toward the bevelled face 44. The internally reflecting properties of the longitudinal surfaces of the member 40 serve to contain the light from the emitting diode 32 within the member 40 so that virtually all of this light is directed to the bevelled end 44 and reflected downward to the portion of the photodiode 12 situated thereunder. It has been found that placing a reflective coating on these longitudinal surfaces of the member 40 does not materially improve the light transmitting characteristics of the element and therefore, in the interest of economy, it is preferred that the element be used without any additional external coating.

The bridge member 40 is placed in position after the fabrication and mounting of the photodiode 12 and emitting diode 32 have been completed as described, including the bonding of the leads in place. A drop of clear epoxy is placed on the upper surface of the emitting diode 32 and another drop of clear epoxy is placed on the adjacent corner of the photodiode 12, after which the bridge member 40 is pushed down against the respective surfaces. The inboard end of the member 40 rests against the surface of the photodiode 12, held in place by the epoxy when it cures. The end of the member 40 which is over the emitting diode 32 will be spaced therefrom by the diameter of the wire lead 36 (approximately 0.001 to 0.002 inches).

After the device has been fabricated in the manner described, an enclosure 50 is fitted over the upper portion of the header 16 bearing the elements mounted on the upper surface 14. This enclosure 50 comprises a metal band 52 to which has been joined by glass-metal sealing a glass window 54. This enclosure is approximately 0.3 inch in diameter and about 0.02 inch high. The glass window 54 may, if desired, be of colored glass to serve as a filter for selected bands of radiation. Alternatively, it may be of clear glass. The band 52 is cemented or welded into place on the header 16 to develop a hermetic seal for the device.

FIG. 3 illustrates an alternative arrangement 10A in accordance with the present invention which is effective for directing the light from three emitting diodes 32A, 32B and 32C, in parallel to a single photodiode 12. It will be understood that the elements shown in FIG. 3 may be mounted on the header 16 of FIG. 1 in the manner described for the first embodiment. As shown in FIG. 3, in which like elements to those of FIG. 1 have been designated by the same reference numerals, the photodetector 12 is shown mounted on a ceramic pad 24 with leads 26 and 28 attached in the manner already described. A wedge-shaped bridge element 80 is positioned with its narrow end over a corner of the photodiode 12. This end has a bevelled surface 81 to reflect light coupled within the member 80 downward to the surface of the photodiode 12. The opposite end of the wedge-shaped member 80 overlies all three of the individually emitting diodes 32A, 32B and 32C which are mounted on an elongated ceramic pad 82, each emitting diode being provided with its corresponding individual lead 36A, 36B, 36C, respectively. The lead 34 which is bonded to the upper gold plated surface of the ceramic pad 82 furnishes the common connection to the three emitting diodes.

As shown in the enlarged sectional view of FIG. 4, the input end of the light conduit member 80 is provided with a curved upper surface 83, which may be parabolic or elliptical, to internally reflect light entering the member 80 from the diodes 32 and redirect it along the longitudinal extent of the member. In the manner previously described for the embodiment of FIG. 1, the member 80 is pressed against the leads 36 on top of the emitting diodes 32 after drops of clear epoxy have been placed thereon. This epoxy 84, when cured, serves to retain the member 80 in the desired juxtaposition relative to the emitting diodes 32 and enhances the transmission of light from the emitting diodes to the light conduit 80.

In operation, the photodetector 12 is used in conventional fashion to develop electrical output signals in response to radiation incident thereon from an external source. When it is desired to test the system or the photodiode by itself, electrical signals are applied to the emitting diode 32, causing it to emit light which is directed by the bridge member to the photodiode 12. Response of the system or of the photodiode alone, as the case may be, may be monitored as the energizing signals are applied to the emitting diode. In this manner, the radiation detector of the present invention is provided with a built-in test capability which may be used for quality testing on a production line or for testing equipment in the field, as is appropriate.

Arrangements in accordance with the present invention as shown and described hereinabove provide an effective means for gathering light from an emitting diode mounted in a generally planar array with a photodiode and directing this light to a portion of the photodiode. The bridge element which overlies the emitting diode and a portion of the photodiode is extremely effective for the intended purpose of collecting nearly all of the light which is emitted by the IRED and conducting that light to the photodetector. This bridge member, or light conduit, provides almost total internal reflection so that light is not permitted to exit the light bridge until it reaches the detector chip. It will be appreciated that other methods for conducting radiation from the emitter to the detector could be devised, but such alternative methods are not considered as effective as the arrangement which are disclosed. For example, a retro-reflector inside the housing could focus emitter radiation onto the detector; however, this would require a very directional emitter to be used and, if the retro-reflector were to be outside the detector field of view, as is necessary to avoid vignetting of the detector, the amount of radiation reaching the detector would be greatly reduced due to the very oblique angle of incidence on the detector. Another possible alternative is the use of a fiber optic light pipe in place of the light bridge. However, this technique requires a great deal more package height above the emitter and detector chips than is often available. This would undesirably limit the incident angle for the photodetector to receive external radiation and, in addition, assembly operations using a fiber optic light pipe would be considerably more difficult and costly than for the presently disclosed package.

Although there have been described above specific arrangements of a radiation detector with built-in test capability in accordance with the invention for the purpose of illustrating the manner in which the invention may be used to advantage, it will be appreciated that the invention is not limited thereto. For example, a series connection of the light emitting diodes in FIG. 3 may alternately be employed. Accordingly, any and all modifications, variations or equivalent arrangements which may occur to those skilled in the art should be considered to be within the scope of the invention as defined in the annexed claims.

What is claimed is:

1. A device for detecting external electromagnetic radiation and generating electrical signals in response thereto comprising:
    a base member having an upper and lower surface and having a plurality of electrical terminals;
    a photodetector mounted on the upper surface of said base member and having electrical connections to corresponding ones of the terminals;
    an opaque enclosure mounted on the base member for enclosing the photodetector, the enclosure including a transparent window spaced from but adjacent to the photodetector for admitting light from an external source to the photodetector wherein said external source is located outside of said enclosure;
    a light emitter mounted on the upper surface of said base adjacent to said photodetector and having electrical connections to some of said plurality of terminals; and
    a prismatic light conduit extending between said light emitter and said photodetector for collecting light from the emitter and directing it to a selected small portion only of the photodetector with minimal obstruction of said light admitted from said external source.

2. The device of claim 1 wherein the photodetector comprises a photodiode of generally planar configuration, the emitter comprises a light emitting diode of generally planar configuration, and both the photodiode and emitting diode are mounted side by side in a generally planar array.

3. The device of claim 2 wherein the prismatic member substantially overlies the light emitting diode and extends to cover a portion of a corner of the photodiode.

4. The device of claim 3 wherein the photodiode is mounted on an upper conductive surface layer of a first ceramic pad which is generally centrally located on the upper surface of said base, and wherein the light emitting diode is mounted on an upper conductive surface layer of a second ceramic pad mounted on said base in a location displaced from but adjacent to the first ceramic pad; and said conductive surface layers are metallic layers plated on their associated ceramic pads.

5. The device of claim 4 wherein the upper conductive surface layers of the two ceramic pads comprise gold plated layers thereon, and further including conducting epoxy affixing the photodiode and light emitting diode to the first and second ceramic pads respectively.

6. The device of claim 5 wherein the electrical connections to the respective photodiode and light emitting diode comprise wire leads which are ball bonded to the upper surfaces of the respective diodes and to a corner of the plated layers of the ceramic pads, respectively.

7. The device of claim 1 wherein the conduit comprises an elongated prismatic member having bevelled end faces at selected angles to the axis of the prismatic member in order to maximize the amount of light conducted from the emitter diode to the photodetector and to minimize the height of said prismatic conduit.

8. The device of claim 7 wherein one bevelled end face of the light conduit overlies the emitter and the other bevelled end faces of the light conduit overlies an adjacent corner of the photodetector.

9. The device of claim 1 wherein the light emitter comprises a plurality of light emitting diodes and the light conduit comprises a wedge-shaped member overlying the plurality of light emitting diodes and a corner of the photodetector.

10. The device of claim 9 wherein the light conduit has a bevelled face at its narrow end for directing light downward to the photodetector and has a curved surface at the wide end overlying the plurality of light emitting diodes for reflecting light from the light emitting diodes internally of the light conduit toward the narrow end.

11. A device for detecting external electromagnetic radiation and generating electrical signals in response thereto comprising:
   a base member having a plurality of electrical terminals;
   an opaque enclosure mounted on said base member, said enclosure including a transparent window for admitting light from a source outside of said enclosure;
   a photodetector mounted on the base member and inside of said enclosure in a position to respond to light directed to it from said external source;
   a light emitter also mounted on the base member and inside of said enclosure in a position offset from the photodetector and having electrical circuit connections to some of said electrical terminals;
   a prismatic light conduit extending between the emitter and a selected small portion only of the photodetector; and
   selective actuation means connected to said light emitter to provide a built-in test capability for the device.

12. The method of testing a photodetector device which has a photodetector mounted on a base member and inside of an enclosure with a transparent window for admitting light from a source located outside said enclosure, said photodetector mounted in a position to receive light from said external source and generate electrical signals in response thereto and an internal light source also mounted on the base member and inside said enclosure in substantially coplanar relationship with but displaced from the photodetector, said method comprising the steps of:
   selectively energizing the internal light source;
   directing substantially all of the light from the internal light source through a prismatic light conduit to only a selected minimum portion of the active surface of the photodetector in order to stimulate the photodetector to generate an output signal without substantially interfering with the light path for external light to the photodetector; and
   monitoring the electrical signals from the photodetector responsive to the internal light source to ascertain the operability thereof.

13. The method of claim 12 wherein the step of applying light to a minimum portion of the photodetector comprises using a prismatic member extending between the internal light source and a corner of the photodetector to collect substantially all of the light emitted by the internal light source and direct it to said portion of the photodetector.

14. The method of fabricating a photodetector device having a built-in test capability, which device is located inside an opaque enclosure having a window for admitting light from an external source located outside of the enclosure, which photodetector is responsive to light from said external source, comprising the steps of:
   affixing on the upper surface of a base member having a plurality of electrical terminals, a pair of ceramic pads, each of which has a gold plated layer deposited on its upper surface, one of said pads being affixed in a generally central location on the base member;
   mounting a photodiode of generally planar configuration on the gold plated layer of the centrally positioned pad by means of conducting epoxy;
   mounting a light emitting diode of generally planar configuration on the gold plated layer of the other ceramic pad by means of conducting epoxy;
   establishing electrical connections to the photodiode and the light emitting diode by ball bonding individual wire leads respectively to the gold plated layers of the two pads and to the upper surfaces of the two diodes;
   forming a bridge member into a prismatic element by developing selectively shaped end surfaces thereof;
   applying clear epoxy to the upper surface of the light emitting diode and to only a corner surface of the photodiode; and
   positioning the prismatic element against the upper surfaces of the two diodes so that one end overlies the light emitting diode and the other end overlies a corner portion only of the photodiode.

15. The method of claim 14 wherein the step of mounting the light emitting diode on the other ceramic pad comprises mounting a plurality of light emitting diodes on the other ceramic pad, and wherein the step of forming the prismatic member includes forming it with a wedge shape such that the wider end of the member is capable of overlying all of the plurality of light emitting diodes.

* * * * *